United States Patent
Clark et al.

(10) Patent No.: US 12,331,390 B2
(45) Date of Patent: Jun. 17, 2025

(54) ARGON-HELIUM BASED COATING

(71) Applicant: VIAVI Solutions Inc., San Jose, CA (US)

(72) Inventors: Andrew Clark, Santa Rosa, CA (US); Georg J. Ockenfuss, Santa Rosa, CA (US)

(73) Assignee: VIA VI SOLUTIONS INC., Chandler, AZ (US)

( * ) Notice: Subject to any disclaimer, the term of this patent is extended or adjusted under 35 U.S.C. 154(b) by 340 days.

(21) Appl. No.: 17/447,308

(22) Filed: Sep. 10, 2021

(65) Prior Publication Data

US 2021/0404053 A1   Dec. 30, 2021

Related U.S. Application Data

(63) Continuation of application No. 16/103,632, filed on Aug. 14, 2018, now Pat. No. 11,131,018.

(51) Int. Cl.
| | |
|---|---|
| C23C 14/35 | (2006.01) |
| C23C 14/00 | (2006.01) |
| C23C 14/10 | (2006.01) |
| C23C 14/14 | (2006.01) |
| C23C 14/34 | (2006.01) |
| C23C 14/56 | (2006.01) |

(52) U.S. Cl.
CPC ......... *C23C 14/35* (2013.01); *C23C 14/0057* (2013.01); *C23C 14/10* (2013.01); *C23C 14/14* (2013.01); *C23C 14/34* (2013.01); *C23C 14/3407* (2013.01); *C23C 14/56* (2013.01)

(58) Field of Classification Search
CPC ...... H01J 37/34; H01J 37/3467; H01J 37/347; H01J 37/3464; H01J 37/3411; H01J 37/3426; H01J 37/3429; H01J 37/3488; H01J 37/3417
USPC ............ 204/298.07, 298.14, 298.24, 298.25
See application file for complete search history.

(56) References Cited

U.S. PATENT DOCUMENTS

| | | | | |
|---|---|---|---|---|
| 5,135,581 A | * | 8/1992 | Tran ..................... | C03C 17/2453 136/258 |
| 5,753,089 A | * | 5/1998 | Haag ................. | H01J 37/32779 204/192.12 |
| 5,976,970 A | | 11/1999 | Dalal et al. | |
| 6,036,824 A | | 3/2000 | Hedgcoth | |

(Continued)

FOREIGN PATENT DOCUMENTS

| | | |
|---|---|---|
| CN | 108121026 A | 6/2018 |
| EP | 3330753 A1 | 6/2018 |

(Continued)

OTHER PUBLICATIONS

Machine Translation JP 05-281406 (Year: 1993).*

(Continued)

*Primary Examiner* — Rodney G McDonald
(74) *Attorney, Agent, or Firm* — FOLEY & LARDNER LLP

(57) ABSTRACT

A sputtering system may include a substrate. The sputtering system may include at least one target. The at least one target may include at least one coating material to coat at least one layer onto the substrate. The at least one coating material may be sputtered onto the substrate in a presence of an inert gas. The inert gas may include argon gas and helium gas.

20 Claims, 7 Drawing Sheets

(56) References Cited

U.S. PATENT DOCUMENTS

| | | | |
|---|---|---|---|
| 6,458,253 B2* | 10/2002 | Ando | C23C 14/0057 204/192.15 |
| 7,442,627 B2 | 10/2008 | Tsuji et al. | |
| 8,879,150 B1 | 11/2014 | Wang et al. | |
| 11,131,018 B2 | 9/2021 | Clark et al. | |
| 2002/0093548 A1 | 7/2002 | Jarrold et al. | |
| 2003/0000474 A1 | 1/2003 | Voutsas et al. | |
| 2003/0207093 A1 | 11/2003 | Tsuji et al. | |
| 2007/0103055 A1 | 5/2007 | Tomai et al. | |
| 2009/0194159 A1 | 8/2009 | Hong et al. | |
| 2009/0283400 A1 | 11/2009 | Stowell et al. | |
| 2010/0224243 A1 | 9/2010 | Le et al. | |
| 2011/0143170 A1 | 6/2011 | Gouk et al. | |
| 2011/0277840 A1 | 11/2011 | Bryden et al. | |
| 2012/0088347 A1 | 4/2012 | Choi et al. | |
| 2014/0158951 A1 | 6/2014 | Yamanobe et al. | |
| 2016/0151774 A1 | 6/2016 | Fukumura et al. | |
| 2016/0231483 A1 | 8/2016 | Hendrix et al. | |
| 2018/0149781 A1 | 5/2018 | Ockenfuss | |
| 2018/0149961 A1 | 5/2018 | Nozawa et al. | |

FOREIGN PATENT DOCUMENTS

| | | | |
|---|---|---|---|
| JP | 62179115 A | * | 8/1987 |
| JP | 05195211 A | * | 8/1993 |
| JP | 05-281406 | * | 10/1993 |
| JP | H08296032 A | | 11/1996 |
| JP | H1112730 A | | 1/1999 |
| JP | 2011012730 A | | 1/2011 |
| KR | 20030045607 A | | 6/2003 |
| KR | 20180062389 A | | 6/2018 |
| TW | 574392 B | | 2/2004 |
| WO | 2009084319 A1 | | 7/2009 |

OTHER PUBLICATIONS

Machine Translation JPS62-179115 (Year: 1986).*
Wang et al. "Gas-phase preparation and size control of Fe nanoparticles", Applied Phys. A. (2011) 103:1015-1020. (Year: 2011).*
Machine Translation JP 05-195211 (Year: 1993).*
Aida M.S., et al., "Enhanced Deposition Rate of Sputtered Amorphous Silicon with a Helium and Argon Gas Mixture," Apr. 15, 1997, 8 pages.
Christopher S., et al., "Characterization of Helium/argon Working Gas Systems in a Radio Frequency Glow Discharge Atomic Emission Source. Part 1: Optical Emission, Sputtering and Electrical Characteristics," Spectrochimica Acta, Part B 53 (1998) 1181-1196.
Duan Z., et al., "Diagnostics and Modeling of an Argon/Helium Plasma Spray Process". Journal of Thermal Spray Technology, vol. 9 (2) Jun. 2000, pp. 225-234.
Extended European Search Report for Application No. EP19191109. 8, mailed on Jan. 23, 2020, 9 pages.
Hartenstein M., et al., "Evaluation of Helium-argon Mixed Gas Plasmas for Bulk and Depth Resolved Analyses by Radiofrequency Glow Discharge Atomic Emission Spectroscopy," Journal of Analytical Atomic Spectrometry, 1999, 14, 1039-1048.
Jia H., et al., "Effect of Helium Partial Pressure on Dc-rnagnetron Sputtering of Co—cr Films". Journal of Magnetism and Magnetic Materials 193 (1999) 124-127.
Johlin E., "Origins and Implications of Intrinsic Stress in Hydrogenated Amorphous Silicon Thin Films," Aug. 24, 2012, 62 pages.
Khojasteh M., et al., "Influence of Source Parameters on the Growth of Metal Nanoparticles by Sputter-gas-aggregation," Applied Nanoscience (2017) 7:875-883.
Mohill M., "Sputtering and Ionization by Helium and Argon in Th Microsecond Pulsed Glow Discharge Using Time-of-flight Ma Spectrometry," PHD Thesis submitted to the University of Florida, 2001, pp. 1-222.
Sahu B., et al., "Effect of Helium Incorporation on Plasma Parameters and Characteristic Properties of Hydrogen Free Carbon Films Deposited Using DC Magnetron Sputtering". Journal of Applied Physics, 127,014901 (2020), pp. 1-9.
Sugimoto I., et al., "Helium Excited Reactive Magnetron Sputtering for Stress Free Silicon Nitride Films," Jan. 24, 1993, 4 pages.
Teo W.B., et al.,, "Depth Analysis of Metal Coatings by Glow Discharge Spectrometry with an Argon-Helium Gas Mixture," Surface and Interface Analysis, vol. 14, pp. 143-152, 1989.
Wagatsuma K., et al., "Effects of Helium Addition to an Argon Glow Discharge Plasma on Emission Lines of SputteredParticles," Analytical Chemistry, 1988, 60, 702-705.
Wang H W., et al., "Enhancement of Adhesion Between Antireflection Coating and Cellulose Triacetate by Surface Pretreatment Using Argon-helium Plasma". Applied Optics, vol. 47 (13), May 1, 2008, pp. C79-C82.

* cited by examiner

| Configuration | Material | Gas Flow | Power (kW) | Coating Rate | Prebake Stress | Postbake Stress (280C) | Postbake / Prebake Change | Stress Reduction Relative To Baseline |
|---|---|---|---|---|---|---|---|---|
| 202 (Baseline) | Si:H | 0 He / 440 Ar / 70 H | 18 | 0.5179 | -1067 | -708 | 34% | 0% |
| 204 | Si:H | 200 He / 240 Ar / 70 H | 18 | 0.4766 | -911 | -493 | 46% | 30% |
| 206 | Si:H | 100 He / 440 Ar / 70 H | 18 | 0.6046 | -1009 | -640 | 37% | 10% |
| 208 | Si:H | 200 He / 440 Ar / 70 H | 18 | 0.5977 | -970 | -564 | 42% | 20% |
| 210 | Si:H | 200 He / 440 Ar / 70 H | 18 | 0.5939 | -968 | -580 | 39% | 17% |
| 212 | Si:H | 250 He / 440 Ar / 70 H | 18 | 0.59 | -979 | -559 | 43% | 21% |

FIG. 2

ARGON-HELIUM BASED COATING

RELATED APPLICATION

This application is a continuation of U.S. patent application Ser. No. 16/103,632, filed Aug. 14, 2018 (now U.S. Pat. No. 11,131,018), which is incorporated herein by reference in its entirety.

BACKGROUND

A coating system may be used to coat a substrate with a particular material. For example, a pulsed direct current (DC) magnetron sputtering system may be used for deposition of thin film layers, thick film layers, and/or the like. Based on depositing a set of layers, an optical element may be formed. For example, a thin film may be used to form a filter, such as an optical interference filter. In some cases, the optical element may be associated with providing a particular functionality at a particular wavelength of light. For example, the optical interference filter may be used for a near-infrared (NIR) range of light, a mid-infrared (MIR) range of light, and/or the like.

In an example, an optical transmitter may emit NIR light that is directed toward an object. In this case, for a gesture recognition system, the optical transmitter may transmit the NIR light toward a user and the NIR light may be reflected off the user toward an optical receiver. The optical receiver may capture information regarding the NIR light, and the information may be used to identify a gesture being performed by the user. For example, a device may use the information to generate a three dimensional representation of the user, and to identify the gesture being performed by the user based on the three dimensional representation.

In another example, information regarding the NIR light may be used to recognize an identity of the user, a characteristic of the user (e.g., a height or a weight), a characteristic of another type of target (e.g., a distance to an object, a size of the object, or a shape of the object), and/or the like. However, during transmission of the NIR light toward the user and/or during reflection from the user toward the optical receiver, ambient light may interfere with the NIR light. Thus, the optical receiver may be optically coupled to an optical filter, such as an optical interference filter, a bandpass filter, and/or the like to allow NIR light to pass through toward the optical receiver.

SUMMARY

According to some implementations, a sputtering system may include a substrate. The sputtering system may include at least one target. The at least one target may include at least one coating material to coat at least one layer onto the substrate. The at least one coating material may be sputtered onto the substrate in a presence of an inert gas. The inert gas may include argon gas and helium gas.

According to some implementations, a coating system may include a vacuum chamber. The coating system may include an inert gas source to dispose an inert gas into the vacuum chamber. The inert gas may include a mixture of argon gas and helium gas. The coating system may be configured to sputter a coating material onto a substrate using the inert gas source.

According to some implementations, a method may include injecting, by a sputtering system, a sputtering gas into a chamber of the sputtering system. The sputtering gas may be a mixture of argon gas and helium gas. The method may include sputtering, by the sputtering system, at least one coating material onto a substrate, disposed in the chamber of the sputtering system, based on injecting the sputtering gas into the chamber of the sputtering system.

BRIEF DESCRIPTION OF THE DRAWINGS

FIG. 2 is a diagram of an example of characteristics of an optical element relating to an example implementation described herein.

DETAILED DESCRIPTION

Figure 1A:
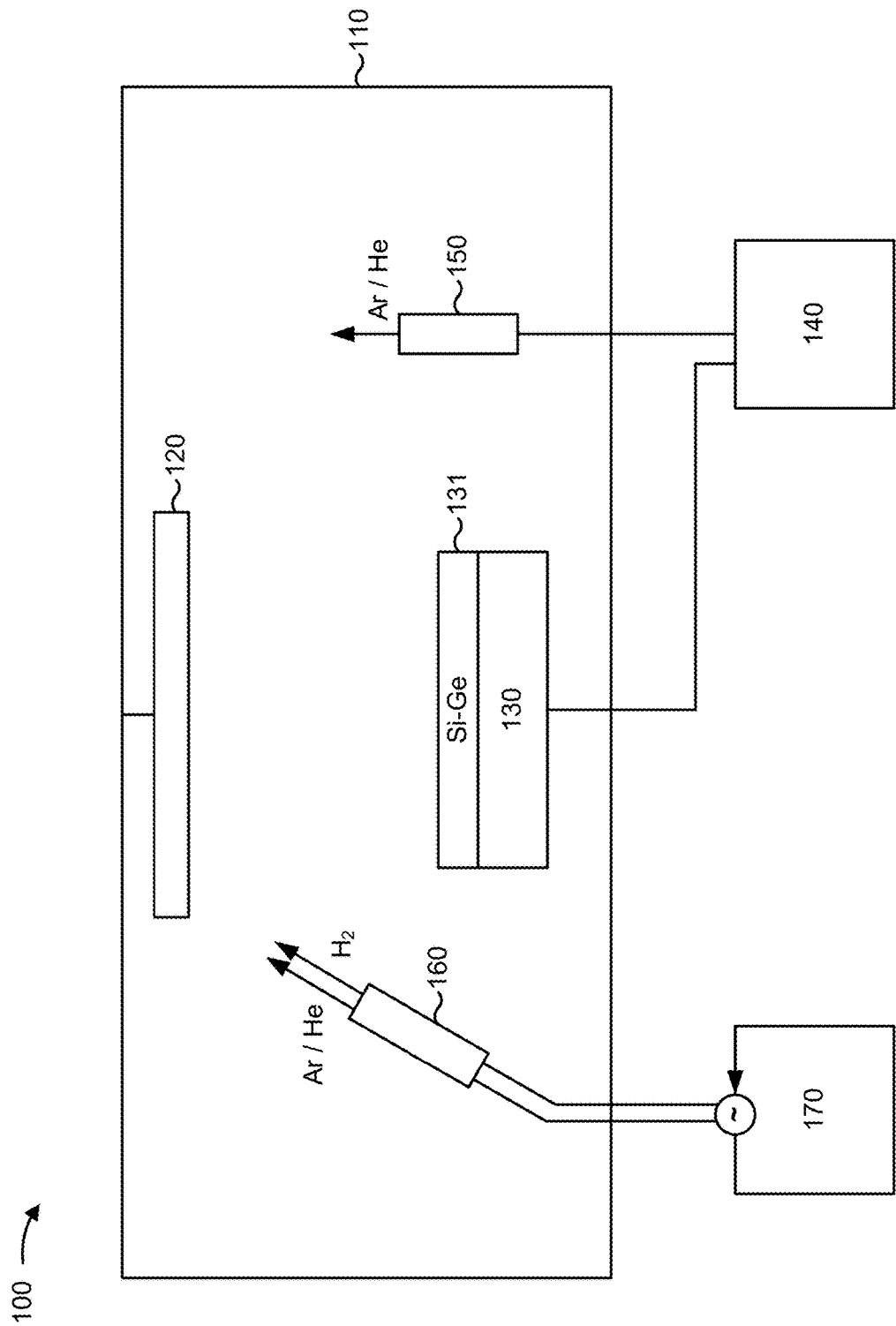
FIGS. 1A-1D are diagrams of an overview of an example implementation described herein.

The following detailed description of example implementations refers to the accompanying drawings. The same reference numbers in different drawings may identify the same or similar elements.

An optical receiver may receive light from an optical source, such as an optical transmitter. For example, the optical receiver may receive near-infrared (NIR) light or mid-infrared (MIR) light from the optical transmitter and reflected off a target, such as a user or another object. In this case, the optical receiver may receive the NIR light as well as ambient light, such as visible spectrum light. The ambient light may include light from one or more light sources separate from the optical transmitter, such as sunlight, light from a light bulb, and/or the like. The ambient light may reduce an accuracy of a determination relating to the NIR light. For example, in a gesture recognition system, the ambient light may reduce an accuracy of generation of a three-dimensional image of the target based on the NIR light. Thus, the optical receiver may be optically coupled to an optical element (e.g., optical filter), such as an optical interference filter, a bandpass filter, and/or the like to filter ambient light and to pass through NIR light toward the optical receiver. Similarly, an optical transmitter may be optically coupled to an optical element, to ensure that a particular type of light (e.g., NIR light) is directed toward a target, such as in a sensing system, a measurement system, a communications system, and/or the like.

The optical element may be manufactured using thin film technology, thick film technology, and/or the like. For example, a pulsed direct current magnetron sputtering system may be used to sputter particles onto a substrate to form one or more thin film layers (sometimes termed thin films). In this case, the sputtering system may sputter the particles (e.g., silicon particles, silicon dioxide particles, germanium particles, silicon-germanium particles, and/or the like) in a sputtering chamber that is filled with an inert gas, such as argon gas.

However, sputtering the particles in, for example, an argon gas environment may result in argon ions being implanted into the thin film with an amount of momentum that exceeds a threshold. As a result, a threshold amount of intrinsic stress (e.g., compressive intrinsic stress) may be formed in the thin film and in the optical element that includes the thin film. An optical element associated with a threshold amount of intrinsic stress may be subject to a threshold amount of warping or curvature, which may result in reduced optical performance of an optical system that includes the optical element. Furthermore, a threshold amount of intrinsic stress may result in difficulties in wafer post-processing (e.g., dicing), which may reduce a manufacturability of optical elements. To reduce intrinsic stress-induced warping, curvature, and/or the like, the optical element may be manufactured with a threshold thickness, which may be achieved by depositing additional layers and/or thicker layers. The additional layers and/or thicker layers may result in excessive package size, cost, manufacturing complexity, time to complete manufacture, and/or the like.

Some implementations, described, herein, may utilize an argon-helium based coating to reduce intrinsic stress in optical elements. For example, a sputter deposition system may use an environment that includes a mixture of argon gas and helium gas, thereby reducing an amount of argon ions implanted into a thin film. In this way, an amount of intrinsic stress in an optical element, such as an optical interference filter coating for NIR wavelengths or MIR wavelengths may be reduced, thereby reducing warping and/or curvature of the optical element. Moreover, based on reducing intrinsic stress, a thickness of the optical element may be reduced without resulting in poor durability of the optical element. In this way, use of argon gas and helium gas as an inert gas environment for sputter deposition reduces package size, reduces cost, reduces complexity, improves manufacturability, and/or the like relative to using an argon gas environment (without helium gas).

FIGS. 1A-1D are diagram of an example 100 of sputter deposition systems described herein.

As shown in FIG. 1A, example 100 includes a vacuum chamber 110, a substrate 120, a cathode 130, a target 131, a cathode power supply 140, an anode 150, a plasma activation source (PAS) 160, and a PAS power supply 170. Target 131 may include a coating material source, such as a silicon material source, a silicon dioxide material source, a germanium material source, a silicon-germanium (SiGe) material source, a hydrogenated germanium material source, and/or the like. PAS power supply 170 may be utilized to power PAS 160 and may include a radio frequency (RF) power supply. Cathode power supply 140 may be utilized to power cathode 130 and may include a pulsed direct current (DC) power supply.

With regard to FIG. 1A, target 131 is sputtered in the presence of hydrogen ($H_2$) (e.g., to hydrogenate a coating material of target 131), as well as an inert gas, such as a mixture of argon gas and helium gas, to deposit a coating material, such as a hydrogenated silicon-germanium material, as a layer on substrate 120. In this way, an optical filter may be manufactured, such as an optical interference filter associated with a passband in the NIR range (e.g., between approximately 700 nanometers (nm) and 2500 nm), in the MIR range (e.g., between approximately 2500 nm and 8000 nm), and/or the like and associated with less than a threshold angle shift (e.g., for three-dimensional sensing and/or other filter functionalities).

Although some implementations, described herein, are described in terms of a sputtering gas that is a mixture of argon gas and helium gas, another mixture may be possible, such as a mixture of argon gas and another gas, helium gas and another gas, or a set of other gasses. Moreover, although some implementations, described herein, are described in terms of a mixture of two gasses, some implementations, described herein may use three or more gasses as an inert gas environment for sputter deposition. Based on using a mixture of argon gas and helium gas, a quantity of argon ions that are implanted into substrate 120 during sputter deposition may be reduced relative to using argon gas as the inert gas (without helium gas). Additional details regarding the inert gas are described herein with regard to FIG. 2.

In some implementations, vacuum chamber 110 may be filled with a first inert gas for a first sputter deposition procedure and a second inert gas for a second sputter deposition procedure. For example, for depositing a first coating (e.g., one or more layers onto a first side of substrate 120) associated with less than a threshold thickness for an optical element, vacuum chamber 110 may be filled with a mixture of argon gas and helium gas, and for depositing a second coating (e.g., one or more layers onto a second side of substrate 120) associated with greater than or equal to the threshold thickness for the optical element, vacuum chamber 110 may be filled with argon gas (without helium gas). In this way, a sputter deposition system may stress balance a wafer that includes coating materials deposited onto both sides of the wafer, thereby improving wafer handling, improving yield for post-coating processing (e.g., dicing of the wafer), reducing transmitted wavefront error, and/or the like relative to a wafer with a greater amount of compressive intrinsic stress.

The inert gas (e.g., argon gas and helium gas) may be injected into the chamber from an inert gas source, such as anode 150 and/or PAS 160. Hydrogen is introduced into the vacuum chamber 110 through PAS 160, which serves to activate the hydrogen. Additionally, or alternatively, cathode 130 may cause hydrogen activation (e.g., in this case, hydrogen may be introduced from another part of vacuum chamber 110). Additionally, or alternatively, anode 150 may cause hydrogen activation (e.g., in this case, hydrogen may be introduced into vacuum chamber 110 by anode 150). In some implementations, the hydrogen may take the form of hydrogen gas, a mixture of hydrogen gas and a noble gas (e.g., argon gas and/or helium gas), and/or the like. PAS 160 may be located within a threshold proximity of cathode 130, allowing plasma from PAS 160 and plasma from cathode 130 to overlap. The use of the PAS 160 allows a thin film layer (e.g., a hydrogenated silicon layer) to be deposited at a relatively high deposition rate. In some implementations, a thin film layer is deposited at a deposition rate of approximately 0.05 nm/s to approximately 2.0 nm/s, at a deposition rate of approximately 0.5 nm/s to approximately 1.2 nm/s, at a deposition rate of approximately 0.8 nm/s, and/or the like.

Although the sputtering procedure is described, herein, in terms of hydrogenated layers (e.g., injecting hydrogen gas to deposit hydrogenated silicon layers, hydrogenated germanium layers, and/or the like), the sputtering procedure may use argon and helium as the inert gas without injecting hydrogen gas to hydrogenate layers. Additionally, or alternatively, although the sputtering procedure is described, herein, in terms of a particular geometry and a particular implementation, other geometries and other implementations are possible. For example, hydrogen may be injected from another direction, from a gas manifold in a threshold proximity to cathode 130, and/or the like.

Figure 1B:
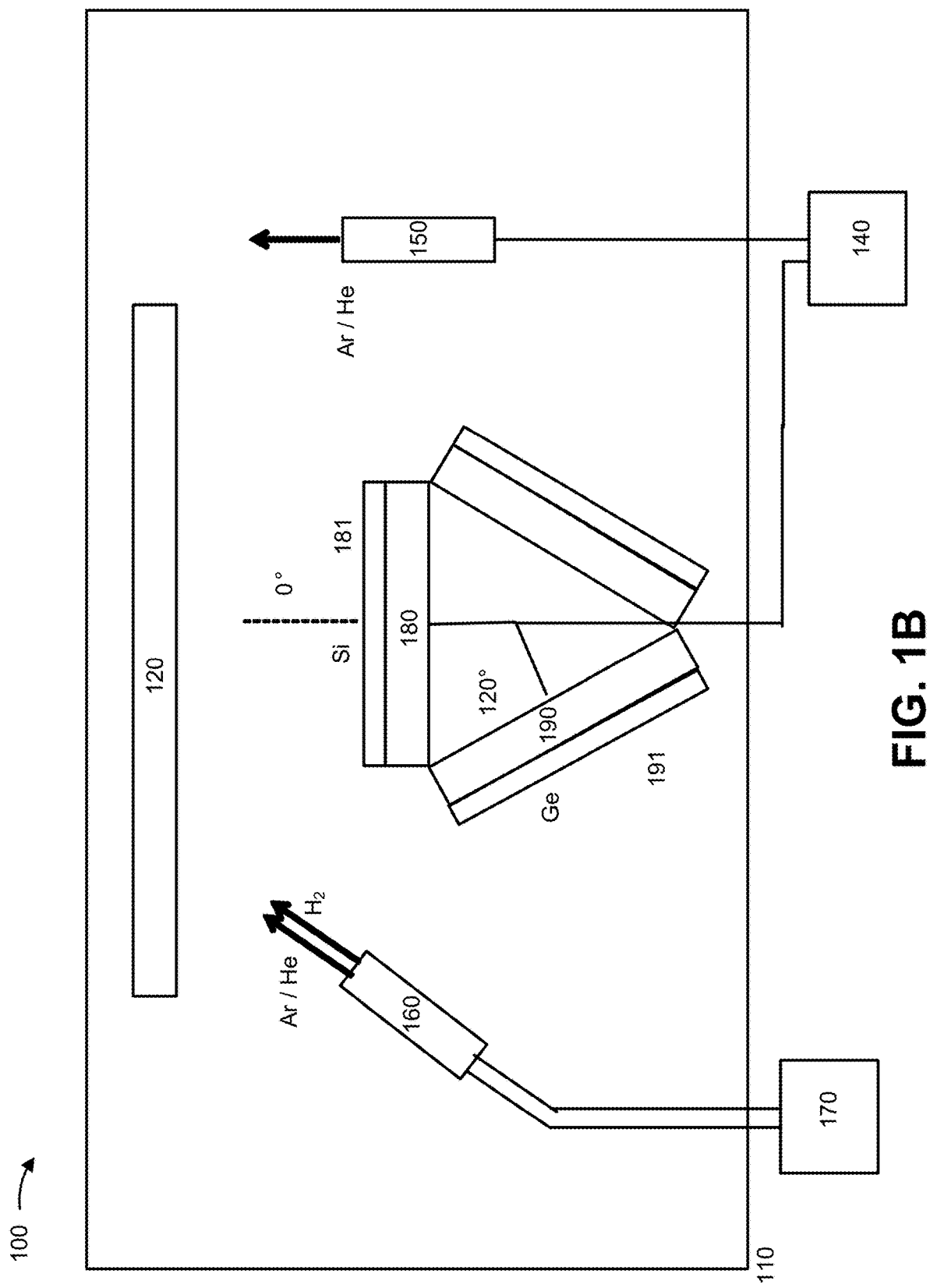
Figure 1C:
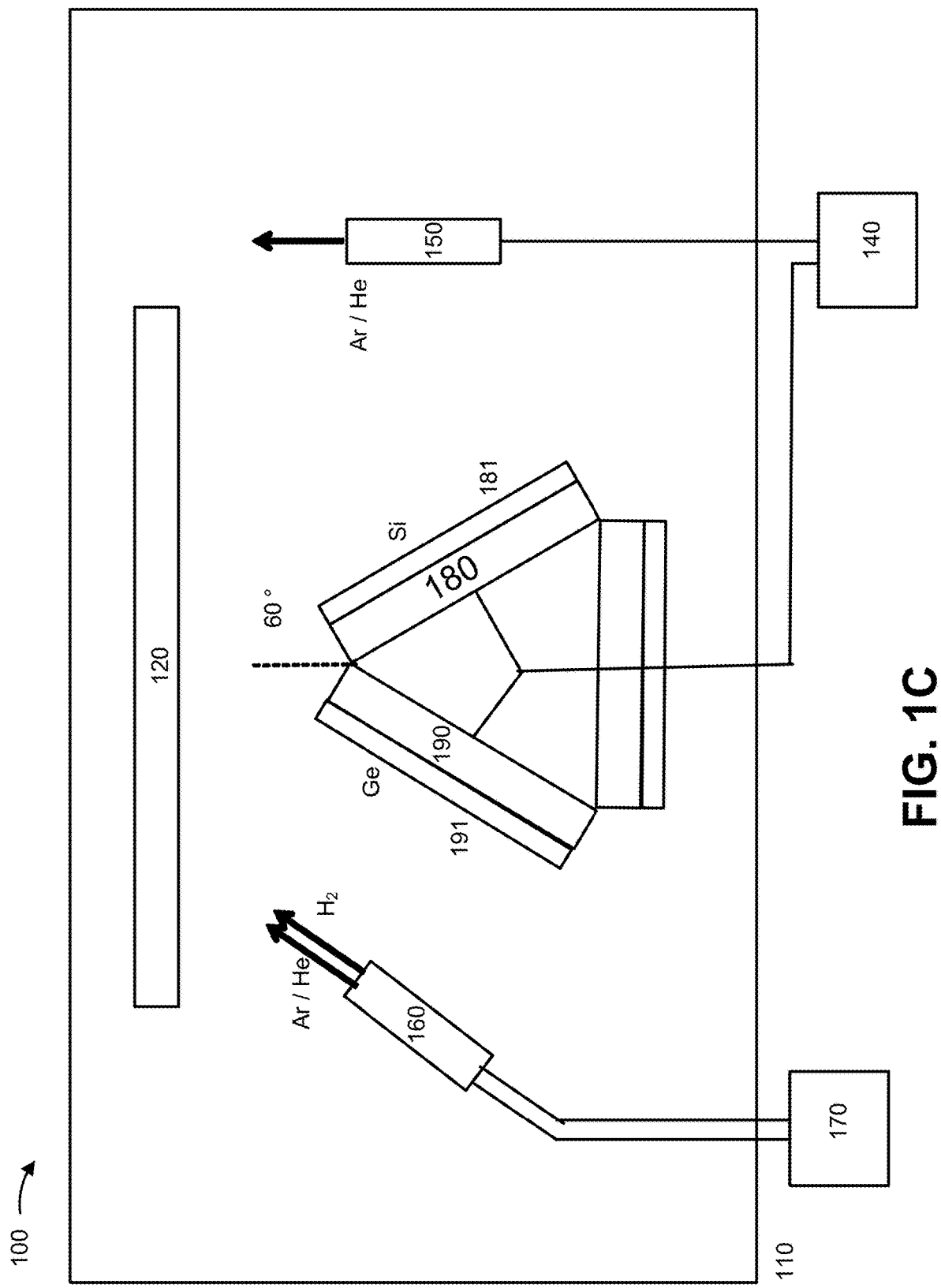

As shown in FIGS. 1B-1C, a similar sputter deposition system includes a vacuum chamber 110, a substrate 120, a first cathode 180, a second cathode 190, a silicon target 181, a germanium target 191, a cathode power supply 140, an anode 150, a plasma activation source (PAS) 160, and a PAS power supply 170. In this case, silicon target 181 is a silicon target and germanium target 191 is a germanium target.

As shown in FIG. 1B, silicon target 181 is oriented at approximately 0 degrees relative to substrate 120 (e.g., approximately parallel to substrate 120) and germanium target 191 is oriented at approximately 120 degrees relative to substrate 120. In this case, silicon and germanium are sputtered by cathode 180 and cathode 190, respectively from silicon target 181 and germanium target 191, respectively, onto substrate 120.

As shown in FIG. 1C, in a similar sputter deposition system, silicon target 181 and germanium target 191 are each oriented at approximately 60 degrees relative to substrate 120, and silicon and germanium are sputtered by cathode 180 and cathode 190, respectively, from silicon target 181 and germanium target 191, respectively, onto substrate 120.

Figure 1D:
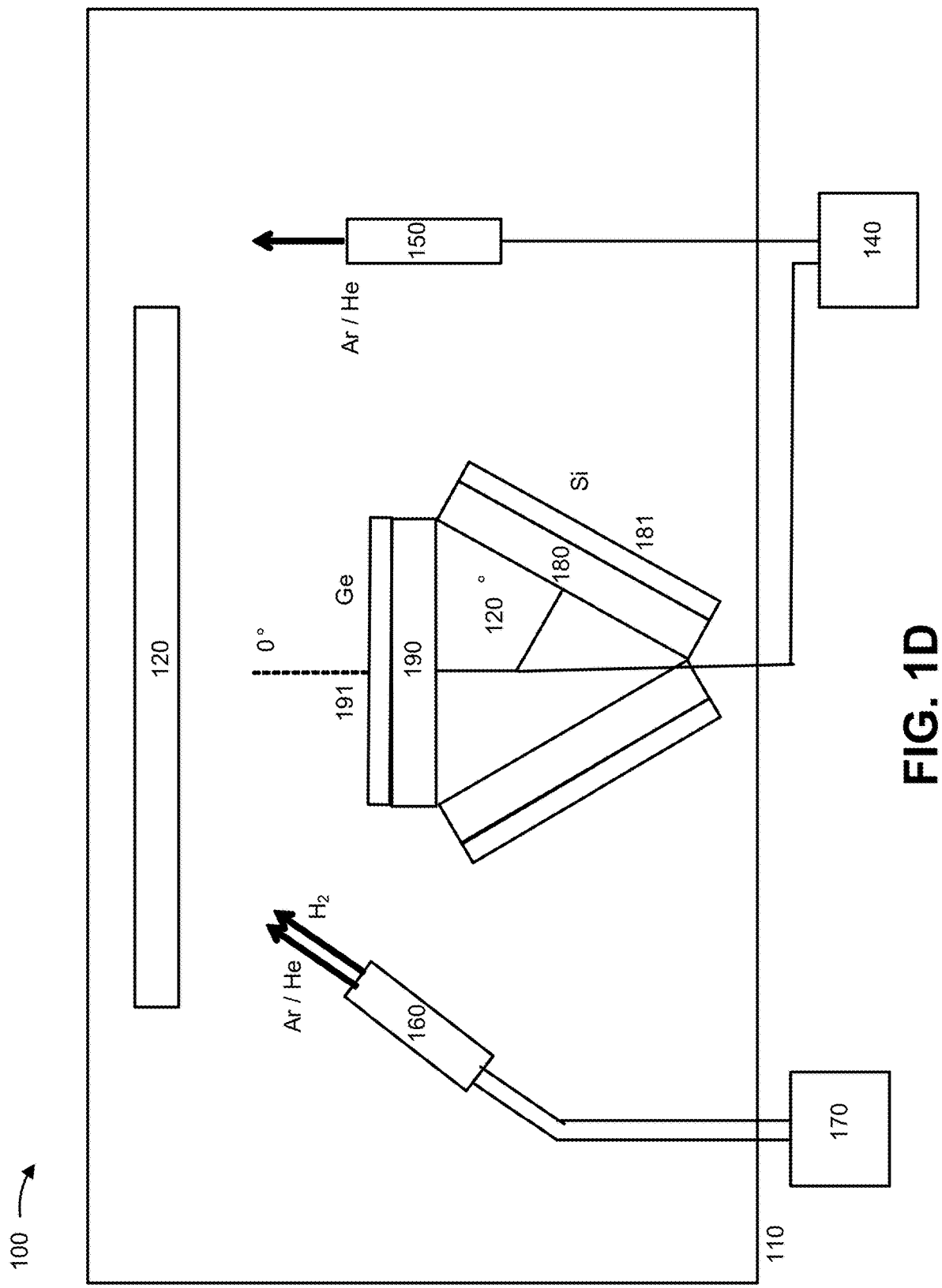

As shown in FIG. 1D, in a similar sputter deposition system, silicon target 181 is oriented at approximately 120 degrees relative to substrate 120 and germanium target 191 is oriented at approximately 0 degrees relative to substrate 120. In this case, silicon and germanium are sputtered by cathode 180 and cathode 190, respectively from silicon target 181 and germanium target 191, respectively, onto substrate 120.

With regard to FIGS. 1A-1D, each configuration of components in a sputter deposition system using argon gas and helium gas as the inert gas may result in a different relative concentration of silicon and germanium with reduced implanting of argon ions relative to similar sputter deposition systems in which helium gas is not used as a portion of the inert gas.

As indicated above, FIGS. 1A-1D are provided merely as an example. Other examples are possible and may differ from what was described with regard to FIGS. 1A-1D.

FIG. 2 is a diagram of an example of characteristics of an optical element relating to an example implementation described herein.

As shown in FIG. 2, characteristics of optical elements manufactured using a set of configurations 202-212 of a sputter deposition system are provided. Configuration 202 represents a baseline case that uses a flow rate of 0 standard cubic centimeters per minute (SCCM) of helium, 440 SCCM of argon, and 70 SCCM of hydrogen. In other words, configuration 202 represents an optical element manufactured using a sputter deposition system that does not include helium in the environment for sputter deposition. As shown, configuration 202 results in an optical element with a coating rate of 0.5179 nanometers per minute (nm/min), a prebake (i.e., pre-annealing) intrinsic stress (e.g., an amount of mechanical intrinsic stress before heating of the optical element to 280 degrees Celsius (C)) of −1067 megapascals (MPa), and a postbake (i.e., post-annealing) intrinsic stress (e.g., an amount of mechanical intrinsic stress after heating of the optical element to 280 C) of −708 MPa. In this case, heating of the optical element results in a 34% reduction in mechanical intrinsic stress.

In some implementations, a sputter deposition system may be associated with a flow rate for argon gas of between approximately 200 SCCM and 500 SCCM, between approximately 240 SCCM and 440 SCCM, and/or the like, and with a helium gas contribution of between approximately 9% and approximately 60%, between approximately 8% and 20%, and/or the like. In some implementations, the sputter deposition system may be associated with a flow rate for helium gas of between approximately 50 SCCM and 300 SCCM, between approximately 100 SCCM and 250 SCCM, and/or the like. In some implementations, the sputter deposition system may be associated with a flow rate for hydrogen gas of between approximately 0 SCCM and 100 SCCM, approximately 70 SCCM, and/or the like, and a concentration of hydrogen gas of between approximately 8% and approximately 60%. In some implementations, the sputter deposition system may be associated with a ratio of argon gas to helium gas of between approximately 1:1 and approximately 1:3.

As further shown in FIG. 2, for configurations 204-212, differing concentrations of helium and argon are used as an inert gas environment for manufacturing corresponding optical elements. As a comparison with the baseline case of configuration 202, using concentrations of helium ranging from 100 SCCM (e.g., in configuration 206) to 250 SCCM (e.g., in configuration 212) and concentrations of argon ranging from 240 SCCM (e.g., in configuration 204) to 440 SCCM (e.g., in configurations 206-212), results in a reduction of intrinsic stress of between 10% (e.g., in configuration 206) and 30% (e.g., in configuration 204) relative to the baseline case. In other words, use of a mixture of helium gas and argon gas as the inert gas environment for sputter deposition, result in a hydrogenated silicon optical element with a reduced prebake intrinsic stress and a reduced postbake intrinsic stress relative to using only argon gas as the inert gas environment.

Although some implementations, described herein, are described in terms of particular concentrations of argon gas and helium gas and in terms of hydrogenated silicon sputtering, other configurations are possible, such as other concentrations, other sputtering materials, and/or the like.

As indicated above, FIG. 2 is provided merely as an example. Other examples are possible and may differ from what was described with regard to FIG. 2.

Figure 3:
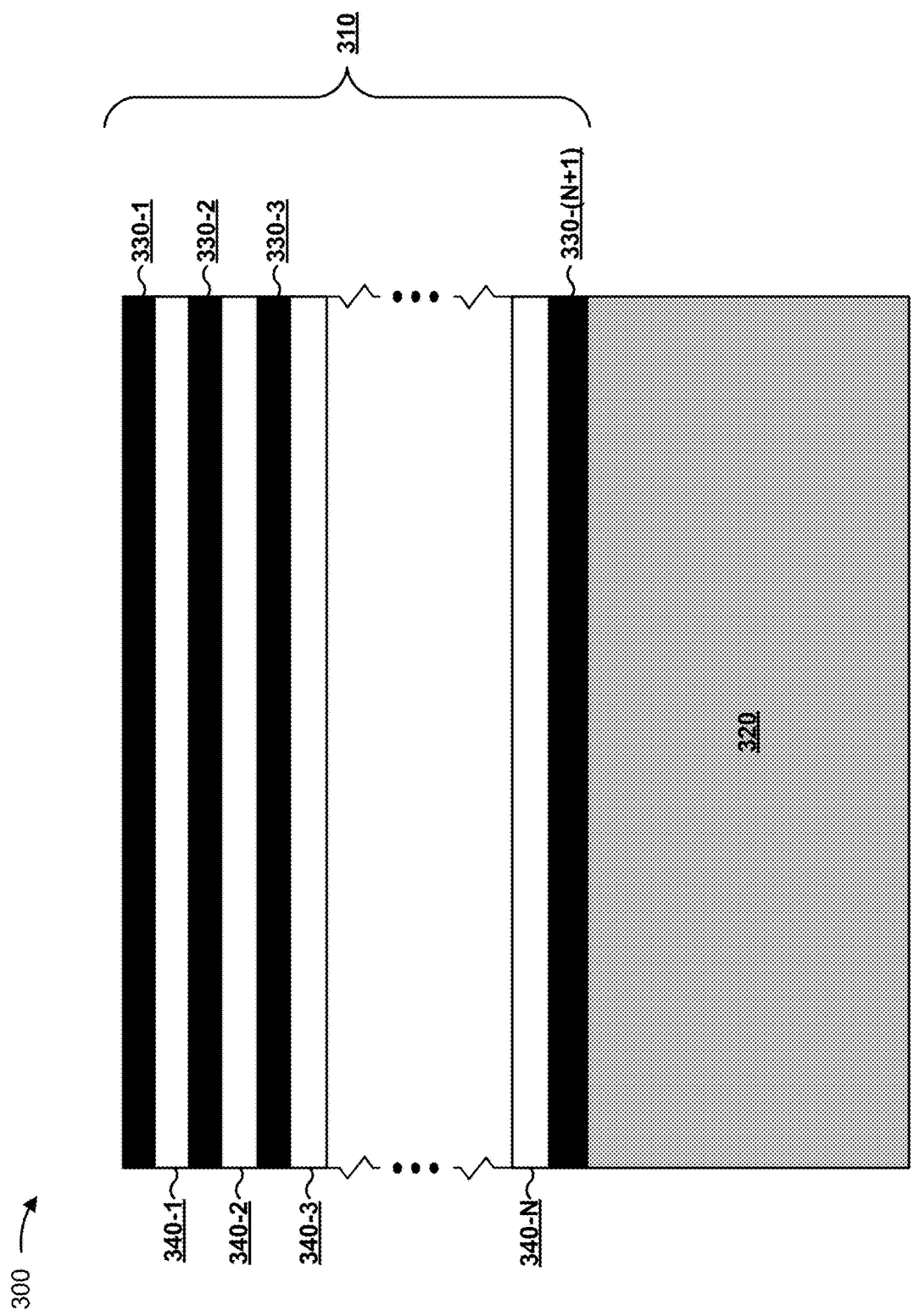
FIG. 3 is a diagram of an example of an optical element relating to an example implementation described herein.

FIG. 3 is a diagram of an example optical filter 300. FIG. 3 shows an example stackup of an optical filter manufactured using a sputter deposition system described herein. As further shown in FIG. 3, optical filter 300 includes an optical filter coating portion 310 and a substrate 320.

Optical filter coating portion 310 includes a set of optical filter layers. For example, optical filter coating portion 310 includes a first set of layers 330-1 through 330-N+1 (N≥1) and a second set of layers 340-1 through 340-N. In another example, optical filter coating portion 310 may be a single type of layer (e.g., one or more layers 330), three or more types of layers (e.g., one or more layers 330, one or more layers 340, and one or more of one or more other types of layers), and/or the like. In some implementations, layers 330 may include a set of layers of a high refractive index material (H layers), such as silicon-germanium (SiGe), hydrogenated silicon-germanium layers, and/or the like. Although some layers may be described as a particular material, such as SiGe, some layers may include (small quantities of) phosphor, boron, nitride, and/or the like. In some implementations, layers 340 may include a set of layers of a low refractive index material (L layers), such as silicon dioxide layers and/or the like. Additionally, or alternatively, the L layers may include silicon nitride layers, Ta2O5 layers, Nb2O5 layers, TiO2 layers, Al2O3 layers, ZrO2 layers, Y2O3 layers, Si3N4 layers, a combination thereof, and/or the like.

In some implementations, optical filter coating portion 310 may be associated with a particular quantity of layers, m. For example, a hydrogenated silicon-germanium based optical filter may include a quantity of alternating layers, such as a range of 2 layers to 200 layers. Based on using an inert gas environment with a mixture of argon gas and helium gas, intrinsic stress may be reduced relative to an argon gas environment (without helium), thereby enabling the particular quantity of layers may be less than a threshold amount, such as less than 200, less than 100, less than 50, less than 20, less than 10, less than 5, and/or the like. In this way, some implementations, described herein, enable optical filters with less than a threshold thickness and without adverse effects to durability, warping, curvature, and/or the like resulting from being less than the threshold thickness.

In some implementations, each layer of optical filter coating portion 310 may be associated with a particular thickness. For example, layers 330 and 340 may each be associated with a thickness of between 1 nm and 1500 nm, between 10 nm and 500 nm, and/or the like. Additionally, or alternatively, optical filter coating portion 310 may be associated with a thickness of between 0.1 μm and 100 μm, 0.25 μm and 10 μm, and/or the like. In some examples, at least one of layers 330 and 340 may each be associated with a thickness of less than 1000 nm, less than 100 nm, or less than 5 nm, and/or the like. Additionally, or alternatively, optical filter coating portion 310 may be associated with a thickness of less than 100 μm, less than 50 μm, less than 10 μm, and/or the like.

In some implementations, a particular silicon-germanium based material may be selected for the layers 330. For example, layers 330 may be selected and/or manufactured (e.g., via a sputtering procedure using a mixture of argon gas and helium gas) to include a particular type of silicon-germanium, such as SiGe-50, SiGe-40, SiGe-60, and/or the like. In some implementations, layers 330 may include trace amounts of another material, such as argon and/or helium, as a result of a sputter deposition procedure in an argon/helium inert gas environment, as described herein.

In some implementations, another material may be selected for layers 340. For example, layers 340 may include a set of silicon layers, a set of germanium layers, a set of silicon dioxide ($SiO_2$) layers, a set of aluminum oxide ($Al_2O_3$) layers, a set of titanium dioxide ($TiO_2$) layers, a set of niobium pentoxide ($Nb_2O_5$) layers, a set of tantalum pentoxide ($Ta_2O_5$) layers, a set of magnesium fluoride ($MgF_2$) layers, a set of silicon nitride ($S_3N_4$) layers, zirconium oxide ($ZrOz_2$), yttrium oxide ($Y_2O_3$), and/or the like. For example, optical filter coating portion 310 may be a silicon/silicon dioxide coating, a germanium/silicon dioxide coating, a silicon-germanium/silicon dioxide coating, and/or the like.

In some implementations, optical filter coating portion 310 may be fabricated using a sputtering procedure. For example, optical filter coating portion 310 may be fabricated using a pulsed-magnetron based sputtering procedure to sputter alternating layers 330 and 340 on a glass substrate or another type of substrate, as described herein. In some implementations, multiple cathodes may be used for the sputtering procedure, such as a first cathode to sputter silicon and a second cathode to sputter germanium, as described herein.

In some implementations, optical filter coating portion 310 may be annealed using one or more annealing procedures, such as a first annealing procedure at a temperature of approximately 280 degrees Celsius or between approximately 200 degrees Celsius and approximately 400 degrees Celsius, a second annealing procedure at a temperature of approximately 320 degrees Celsius or between approximately 250 degrees Celsius and approximately 350 degrees Celsius, and/or the like.

As indicated above, FIG. 3 is provided merely as an example. Other examples are possible and may differ from what was described with regard to FIG. 3.

Figure 4:
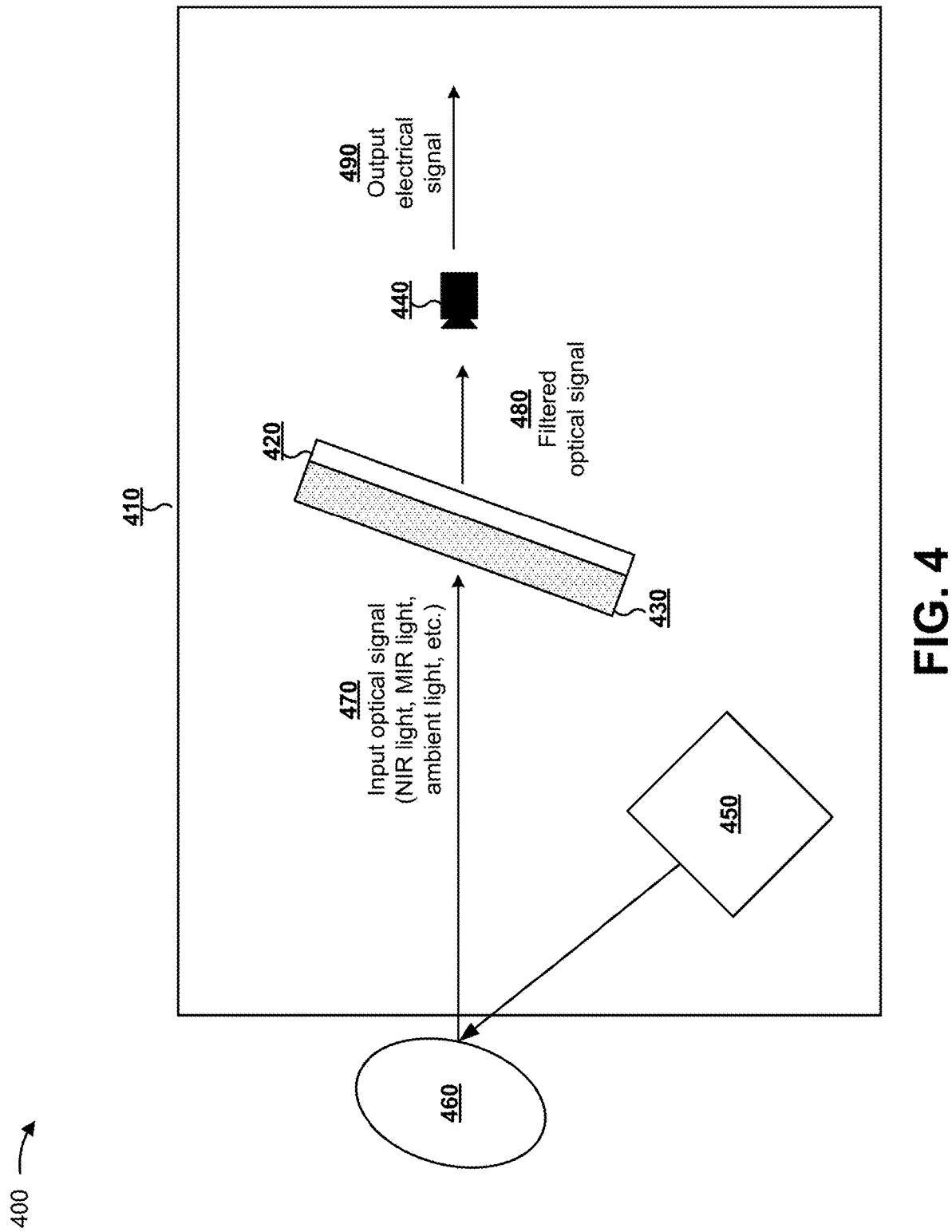
FIG. 4 is a diagram of an optical system including an optical element relating to an example implementation described herein.

FIG. 4 is a diagrams of an example implementation 400 described herein. As shown in FIG. 4, example implementation 400 includes a sensor system 410. Sensor system 410 may be a portion of an optical system, and may provide an electrical output corresponding to a sensor determination. Sensor system 410 includes an optical filter structure 420, which includes an optical filter 430, and an optical sensor 440. For example, optical filter structure 420 may include an optical filter 430 that performs an optical interference functionality or another type of optical filter such as a polarization beam splitting functionality, a reverse polarization beam splitting functionality, and/or the like. Sensor system 410 includes an optical transmitter 450 that transmits an optical signal toward a target 460 (e.g., a person, an object, etc.).

Although implementations, described herein, may be described in terms of an optical filter in a sensor system, implementations described herein may be used in another type of system, may be used external to the sensor system, and/or the like.

As further shown in FIG. 4, and by reference number 470, an input optical signal is directed toward optical filter structure 420. The input optical signal may include NIR light, MIR light, and/or the like emitted by optical transmitter 450 and ambient light from the environment in which sensor system 410 is being utilized. For example, when optical filter 430 is a bandpass filter, optical transmitter 450 may direct NIR light toward a user for a gesture recognition system (e.g., of a gesture performed by target 460), and the NIR light may be reflected off target 460 (e.g., a user) toward optical sensor 440 to permit optical sensor 440 to perform a measurement of the NIR light. In this case, ambient light may be directed toward optical sensor 440 from one or more ambient light sources (e.g., a light bulb or the sun).

In another example, multiple light beams may be directed toward target 460 and a subset of the multiple light beams may be reflected toward optical filter structure 420, which may be disposed at a tilt angle relative to optical sensor 440, as shown. In some implementations, another tilt angle may be used (e.g., a 0 degree tilt angle for a bandpass filter). In some implementations, optical filter structure 420 may be disposed and/or formed directly onto optical sensor 440, rather than being disposed a distance from optical sensor 440. For example, optical filter structure 420 may be coated and patterned onto optical sensor 440 using, for example, photolithography, a sputter deposition technique (e.g., using argon gas and helium gas as an inert gas mixture for sputter deposition), and/or the like. In another example, optical transmitter 450 may direct NIR light toward another type of target 460, such as for detecting objects in proximity to a vehicle, detecting objects in proximity to a blind person, detecting a proximity to an object (e.g., using a LIDAR technique), and/or the like, and the NIR light and ambient light may be directed toward optical sensor 440 as a result.

As further shown in FIG. 4, and by reference number 480, a portion of the optical signal is passed by optical filter 430 and optical filter structure 420. For example, alternating silicon-germanium layers (e.g., a high index material) and another type of material layers (e.g., a low index material, such as silicon dioxide ($SiO_2$)) of optical filter 430 may cause the first polarization of light to be reflected in a first direction. In this case, based on using a sputter deposition technique with a mixture of argon gas and helium gas as an inert gas environment for sputtering, an amount of intrinsic stress in optical filter 430 may be reduced relative to other techniques, thereby enabling a reduced thickness for optical filter 430, a reduced size for sensor system 410, and/or the like.

As further shown in FIG. 4, and by reference number 490, based on the portion of the optical signal being passed to optical sensor 440, optical sensor 440 may provide an output electrical signal for sensor system 410, such as for use in recognizing a gesture of the user or detecting the presence of an object. In some implementations, another arrangement of optical filter 430 and optical sensor 440 may be utilized. For example, rather than passing the second portion of the optical signal collinearly with the input optical signal, optical filter 430 may direct the second portion of the optical signal in another direction toward a differently located optical sensor 440. In another example, optical sensor 440 may be an avalanche photodiode, a silicon based detector, an Indium-Gallium-Arsenide (InGaAs) detector, an infrared detector, and/or the like.

As indicated above, FIG. 4 is provided merely as an example. Other examples are possible and may differ from what was described with regard to FIG. 4.

In this way, an optical element, an optical filter, an optical system, a sensor system, and/or the like may be manufactured using a sputter deposition procedure. Based on using a mixture of argon gas and helium gas as an inert gas environment for sputtering, a quantity of argon ions embedded into a sputtered layer of the optical filter may be reduced, thereby reducing an amount of intrinsic stress in the sputtered layer relative to using an argon gas environment (without helium gas). In this case, based on reducing the amount of intrinsic stress in the sputtered layer, a thickness of the sputtered layer, the optical system, the sensor system, and/or the like may be reduced (relative to a sputtered layer with an increased amount of intrinsic stress) without excessive curvature, warping, and/or the like.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A sputtering system, comprising:
 a substrate;
 a first target on a first cathode,
  wherein the first target comprises a first coating material source;
 a second target on a second cathode, and
  wherein the second target comprises a second coating material source;
 a cathode power supply configured to power the first cathode and the second cathode; and
 a vacuum chamber configured to be filled with a mixture of argon gas and helium gas when a first coating is deposited onto a first side of the substrate and to be filled with argon gas, without helium gas, when a second coating is deposited onto a second side of the substrate,
  wherein the first coating has a first thickness,
  wherein the second side of the substrate is different from the first side of the substrate,
  wherein the first coating includes one or more first materials that are different from one or more second materials of the second coating,
  wherein the second coating has a second thickness that is greater than the first thickness, and
  wherein, in the mixture of argon gas and helium gas, a flow rate for argon gas is configured to be between 200 standard cubic centimeters per minute (SCCM) and 500 SCCM and a helium gas contribution is configured to be between 9% and 60%.

2. The sputtering system of claim 1, wherein the mixture of argon gas and helium gas is associated with an argon gas to helium gas ratio of between approximately 1:1 and approximately 1:3.

3. The sputtering system of claim 1, wherein, in the mixture of argon gas and helium gas, the helium gas contribution is configured to be between 15% to 55%.

4. The sputtering system of claim 1, wherein the one or more first materials is sputtered onto the substrate in a presence of hydrogen gas to hydrogenate the one or more first materials.

5. The sputtering system of claim 4, wherein the presence of hydrogen gas is associated with a concentration of approximately 8% to approximately 20% of total gas.

6. The sputtering system of claim 1, wherein the first coating includes a first set of layers that include the one or more first materials,
 wherein the one or more first materials include one or more of silicon-germanium or hydrogenated silicon-germanium,
 wherein one or more of the first coating or the second coating includes a second set of layers that includes the one or more second materials, and
 wherein the second set of layers include one or more of silicon dioxide, silicon nitride, tantalum pentoxide, niobium pentoxide, titanium dioxide, aluminum oxide, zirconium dioxide, or yttrium oxide.

7. The sputtering system of claim 1, wherein the sputtering system is a pulsed direct current magnetron sputtering system.

8. The sputtering system of claim 1, wherein a post-annealing intrinsic stress level of the first coating is less than when only argon gas is used to deposit the second coating.

9. A coating system, comprising:
 a vacuum chamber configured to be filled with a mixture of argon gas and helium gas when a first coating is deposited onto a first side of a substrate and to be filled with argon gas, without helium gas, when a second coating is deposited onto a second side of the substrate;
 a first target on a first cathode, wherein the first target comprises a first coating material source;
a second target on a second cathode, and
wherein the second target comprises a second coating material source;
a cathode power supply configured to power the first cathode and the second cathode; and
an inert gas source configured to dispose the mixture of argon gas and helium gas into the vacuum chamber,
wherein the first coating has a first thickness that is less than a second thickness of the second coating,
wherein the first coating includes one or more first materials that are different from one or more second materials of the second coating,
wherein the second side of the substrate is different from the first side of the substrate, and
wherein, in the mixture of argon gas and helium gas, a flow rate for argon gas is between 200 standard cubic centimeters per minute (SCCM) and 500 SCCM.

10. The coating system of claim 9, wherein the inert gas source is at least one of a plasma activation source or an anode.

11. The coating system of claim 9, wherein the first coating material source is configured to provide a coating material, of the one or more first materials, that is deposited as the first coating.

12. The coating system of claim 9, wherein the second coating material source is configured to provide a coating material, of the one or more second materials, that is deposited as the second coating.

13. The coating system of claim 9, further comprising another power supply configured to cause the mixture of argon gas and helium gas to be disposed into the vacuum chamber to sputter a coating material, of the one or more first materials, onto the substrate.

14. The coating system of claim 11, wherein the coating material includes at least one of:
a silicon material, a silicon dioxide material,
a silicon-germanium material, or
a germanium material.

15. The coating system of claim 9, wherein the coating system is configured to form an optical filter.

16. The coating system of claim 15, wherein the optical filter is associated with a passband of between approximately 700 nanometers (nm) and 2500 nm or between approximately 2500 nm and 8000 nm.

17. A system, comprising:
a first target on a first cathode,
wherein the first target comprises a first coating material source;
a second target on a second cathode, and
wherein the second target comprises a second coating material source;
a cathode power supply configured to power the first cathode and the second cathode;
a vacuum chamber configured to be filled with a first inert gas when a first coating is deposited onto a first side of a substrate and to be filled with a second inert gas when a second coating is deposited onto a second side of the substrate,
wherein the first coating includes a first material from the first coating material source and the second coating includes a second material from the second coating material source,
wherein the first inert gas is a mixture of a first gas and a second gas, and
wherein, in the mixture, a flow rate for the first gas is between 200 SCCM and 500 SCCM and a contribution of the second gas is between 9% and 60%; and
an inert gas source configured to dispose the first inert gas into the vacuum chamber.

18. The system of claim 17, wherein the first gas is argon gas, and
wherein the second gas is helium gas.

19. The system of claim 17, wherein the vacuum chamber is configured to be filled with the second inert gas without helium gas.

20. The system of claim 17, wherein the first coating has a first thickness that is less than a second thickness of the second coating.

* * * * *